(12) United States Patent
Ha et al.

(10) Patent No.: US 11,108,014 B2
(45) Date of Patent: Aug. 31, 2021

(54) FLEXIBLE DISPLAY DEVICE

(71) Applicant: Samsung Display Co., Ltd., Yongin-si (KR)

(72) Inventors: Seung Hwa Ha, Hwaseong-si (KR); Seung-Ho Jung, Hwaseong-si (KR); Kyu Young Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/726,074

(22) Filed: Dec. 23, 2019

(65) Prior Publication Data

US 2020/0251679 A1 Aug. 6, 2020

(30) Foreign Application Priority Data

Feb. 1, 2019 (KR) .......................... 10-2019-0013738

(51) Int. Cl.
*H01L 51/52* (2006.01)
*H01L 27/32* (2006.01)

(52) U.S. Cl.
CPC ........ *H01L 51/5246* (2013.01); *H01L 27/323* (2013.01); *H01L 51/524* (2013.01); *H01L 51/5293* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 10,230,062 B2 | 3/2019 | Kim et al. | |
| 10,379,281 B2 | 8/2019 | Min et al. | |
| 2015/0147532 A1 | 5/2015 | Nam et al. | |
| 2015/0207102 A1 | 7/2015 | Jeong et al. | |
| 2017/0153668 A1 | 6/2017 | Jang et al. | |
| 2018/0013080 A1 | 1/2018 | Kim et al. | |
| 2018/0150106 A1 | 5/2018 | Jang et al. | |
| 2018/0203321 A1 | 7/2018 | Shin et al. | |
| 2019/0067606 A1 | 2/2019 | Han et al. | |

FOREIGN PATENT DOCUMENTS

| | | |
|---|---|---|
| KR | 10-2017-0064453 | 6/2017 |
| KR | 10-2018-0006530 | 1/2018 |
| KR | 10-2018-0034833 | 4/2018 |
| KR | 10-2018-0036260 | 4/2018 |
| KR | 10-2018-0085399 | 7/2018 |
| KR | 10-1888451 | 8/2018 |

OTHER PUBLICATIONS

Extended European Search Report dated Jun. 16, 2020 in European Patent Application No. 20154775.9.

*Primary Examiner* — Vip Patel
(74) *Attorney, Agent, or Firm* — H.C. Park & Associates, PLC

(57) ABSTRACT

A flexible display device including a display panel, a cover window disposed on the display panel, and a first adhesive layer disposed between the display panel and the cover window, in which the first adhesive layer includes a first pressure sensitive adhesive layer, a second pressure sensitive adhesive layer, and a first elastomer layer disposed between the first pressure sensitive adhesive layer and the second pressure sensitive adhesive layer.

18 Claims, 15 Drawing Sheets

1

FLEXIBLE DISPLAY DEVICE

CROSS-REFERENCE TO RELATED APPLICATION

This application claims priority from and the benefit of Korean Patent Application No. 10-2019-0013738, filed on Feb. 1, 2019, which is hereby incorporated by reference for all purposes as if fully set forth herein.

BACKGROUND

Field

Exemplary embodiments of the invention relate generally to a flexible display device and, more specifically, to a flexible display device including an adhesive layer.

Discussion of the Background

Display devices, such as an organic light emitting display and a liquid crystal display, include a display panel manufactured by forming several layers and elements on a substrate. Glass is generally used as the substrate of the display panel. However, the glass substrate is heavy and may be easily broken. Further, the glass substrate is generally rigid so it is difficult to deform the display device. Recently, a flexible display panel using a flexible substrate that is light, strong against impacts, and can be easily deformed, and a flexible display device including the same, have been developed.

The flexible display device may be classified into a bendable display device, a foldable display device, a rollable display device, and a stretchable display device depending on its use and form. To protect the flexible display panel, a cover window may be attached on the flexible display panel. In order for the flexible display device to be bendable, foldable, rollable, or stretchable, the window must also be flexible. However, the flexible window may be more vulnerable to an impact than the rigid window.

The above information disclosed in this Background section is only for understanding of the background of the inventive concepts, and, therefore, it may contain information that does not constitute prior art.

SUMMARY

Flexible display devices constructed according to exemplary embodiments of the invention have an improved impact resistance while satisfying characteristics of a flexible display device.

Additional features of the inventive concepts will be set forth in the description which follows, and in part will be apparent from the description, or may be learned by practice of the inventive concepts.

A flexible display device according to an exemplary embodiment includes a display panel, a cover window disposed on the display panel, and a first adhesive layer disposed between the display panel and the cover window, in which the first adhesive layer includes a first pressure sensitive adhesive layer, a second pressure sensitive adhesive layer, and a first elastomer layer disposed between the first pressure sensitive adhesive layer and the second pressure sensitive adhesive layer.

The display device may further include a first functional layer disposed between the first adhesive layer and the display panel, and a second adhesive layer disposed between the first functional layer and the display panel, in which the second adhesive layer may include a third pressure sensitive adhesive layer, a fourth pressure sensitive adhesive layer, and a second elastomer layer between the third pressure sensitive adhesive layer and the fourth pressure sensitive adhesive layer.

The first functional layer may include at least one of a polarization layer or a touch panel.

The display device may further include a second functional layer disposed between the second adhesive layer and the display panel, and a third adhesive layer disposed between the second functional layer and the display panel, in which the third adhesive layer may include a fifth pressure sensitive adhesive layer, a sixth pressure sensitive adhesive layer, and a third elastomer layer between the fifth pressure sensitive adhesive layer and the sixth pressure sensitive adhesive layer.

The second functional layer may include at least one of a polarization layer or a touch panel.

The first adhesive layer may have a thickness less than about 75 micrometers.

An adhesion between the first pressure sensitive adhesive layer and the first elastomer layer may be about 400 gf/in$^2$ or more.

The first elastomer layer may have a modulus of about 100 kPa or less.

The first adhesive layer may further include a side pressure sensitive adhesive layer enclosing a side of the first elastomer layer.

The first elastomer layer may include an elastomer base layer and a plurality of columns disposed within the elastomer base layer.

The plurality of columns may have a higher modulus than the elastomer base layer.

The plurality of columns may have a lower end in contact with the first pressure sensitive adhesive layer and an upper end in contact with the second pressure sensitive adhesive layer.

The first adhesive layer may further include a third pressure sensitive adhesive layer and a second elastomer layer between the second pressure sensitive adhesive layer and the third pressure sensitive adhesive layer.

The first elastomer layer may include a cutting pattern formed on at least one surface thereof, the cutting pattern being formed in a direction oblique to a longitudinal direction of the first elastomer layer.

The first elastomer layer may include a lower elastomer layer, a middle elastomer layer, and an upper elastomer layer that are continuously stacked, and the middle elastomer layer may include a groove pattern formed on at least one surface thereof.

The first elastomer layer may include a lower elastomer layer and an upper elastomer layer that are continuously stacked, and the lower elastomer layer and the upper elastomer layer may include a groove pattern formed at an interface therebetween.

The first elastomer layer may include a pore pattern formed therein.

A flexible display device according to another exemplary embodiment includes a display panel, a cover window disposed on the display panel, at least one functional layer disposed between the cover window and the display panel, a first adhesive layer disposed between the display panel and the functional layer, and a second adhesive layer disposed between the functional layer and the cover window, in which each of the first and second adhesive layers may include a plurality of pressure sensitive adhesive layers and at least one elastomer layer disposed between the plurality of pressure sensitive adhesive layers.

Each of the first and second adhesive layers may further include a side pressure sensitive adhesive layer enclosing a side of the respectively elastomer layer.

The elastomer layer may include an elastomer base layer and a plurality of columns disposed within the elastomer base layer.

The exemplary embodiments may provide flexible display devices with improved impact resistance while satisfying a characteristic of the flexible display devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
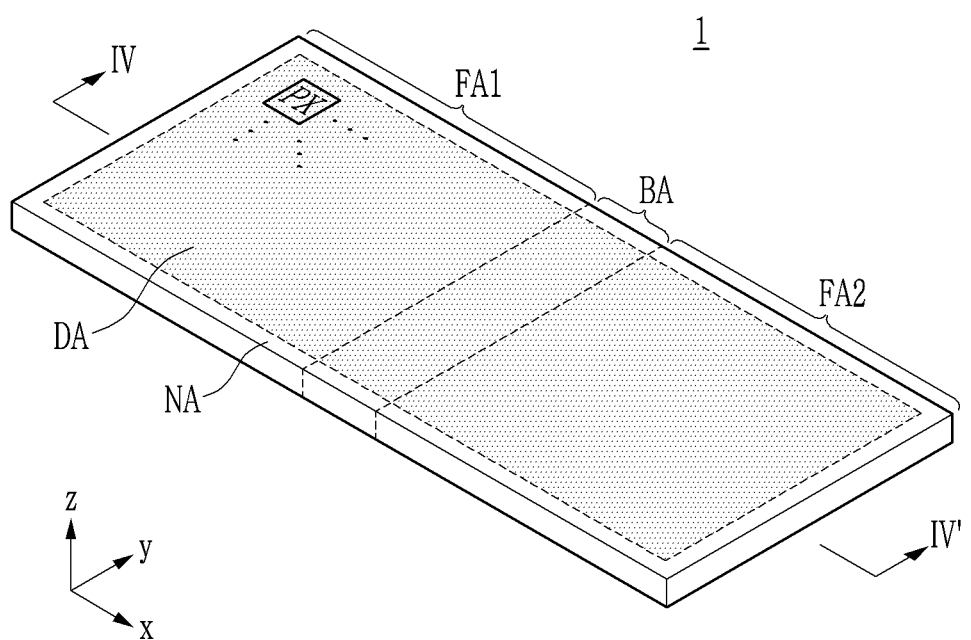
FIG. 1 is a perspective view schematically showing an unfolded state of a foldable display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A flexible display device according to an exemplary embodiment will be described below with reference to FIG. 1 to FIG. 3.

Figure 2:
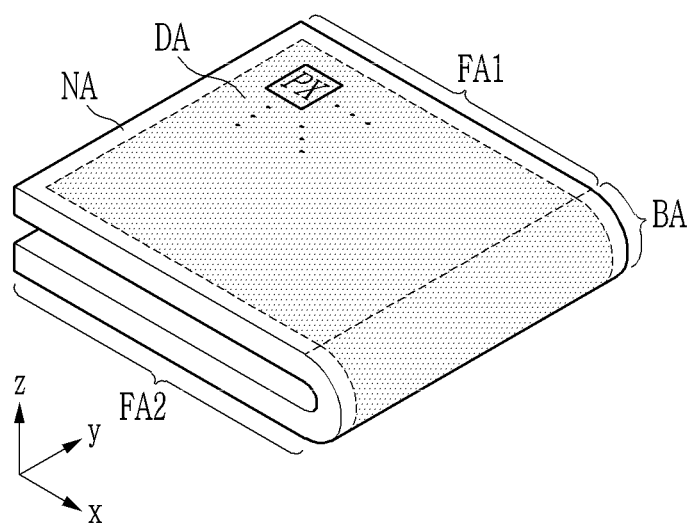
FIG. 2 is a perspective view schematically showing a first folding state of the foldable display device of FIG. 1.
Figure 3:
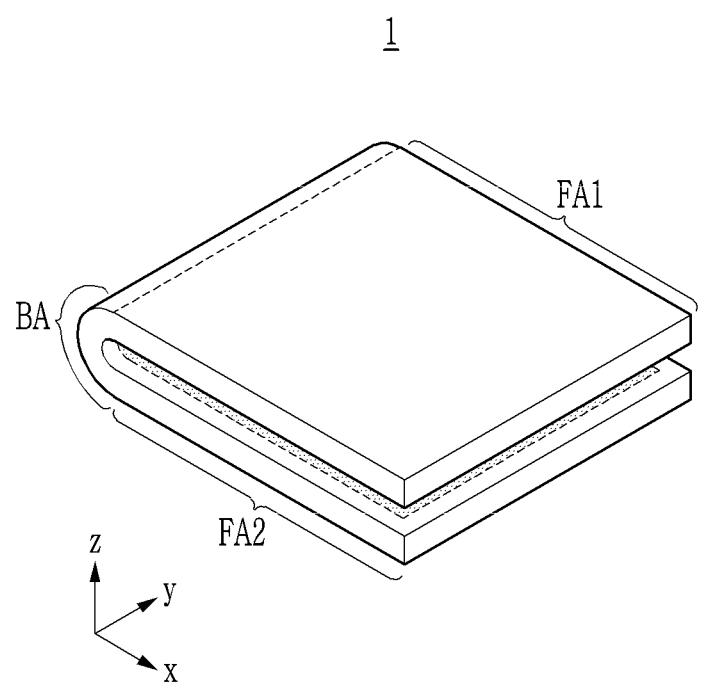
FIG. 3 is a perspective view schematically showing a second folding state of the foldable display device of FIG. 1.

FIG. 1 is a perspective view schematically showing an unfolded state of a foldable display device according to an exemplary embodiment, FIG. 2 is a perspective view schematically showing a first folding state of the foldable display device of FIG. 1, and FIG. 3 is a perspective view schematically showing a second folding state of the foldable display device of FIG. 1.

The foldable display device 1 (hereinafter, referred to as a display device) may be entirely unfolded to be substantially flat as shown in FIG. 1, and may be folded as shown in FIGS. 2 and 3. The display device 1 may include a bending area BA, and a first flat area FA1, and a second flat area FA2 on respective sides of the bending area BA. The bending area BA is a region that may be bent when folding the display device 1, and the first flat area FA1 and the second flat area FA2 are regions which are not substantially bent. The bending area BA may be substantially flat when the display device 1 is unfolded.

FIGS. 1 to 3 show that the display device 1 includes one bending area BA, however, the inventive concepts are not limited thereto. In some exemplary embodiments, the display device 1 may include a plurality of bending areas BA separated from each other, which may be bent with different curvature radiuses. For example, the display device 1 may include two or more bending areas and three or more flat areas.

The display device 1 may include a display area DA where an image is displayed and a non-display area NA surrounding the display area DA. The display area DA may correspond to a screen, where pixels PX are arranged, and the non-display area NA may correspond to a bezel.

The display device 1 may be folded as shown in FIG. 2, so that the screen is exposed to the outside (hereinafter, referred to as out-folding or first folding). Alternatively, the display device 1 may be folded as shown in FIG. 3, so that the screen faces, that is, the screen of the first flat area FA1 and the screen of the second flat area FA2 face each other (hereinafter, referred to as in-folding or second folding). In the out-folding state, the screen of the bending area BA may be exposed to the user to be visible, while the screen of the bending area BA may be hidden in the in-folding state. According to an exemplary embodiment, the display device 1 may be designed to be bent only in one of the out-folding and the in-folding. According to another exemplary embodiment, when the display device 1 includes a plurality of bending areas BA, one of them may be the bending area that is out-foldable, and the other one may be the bending area that is in-foldable.

The display device 1 may further include a housing. The housing may receive several parts constituting the display device 1, such as a display panel, a driving device, a processor, a memory, a printed circuit board (PCB), a battery, a communication module, a speaker, various sensors, and the like.

Figure 4:
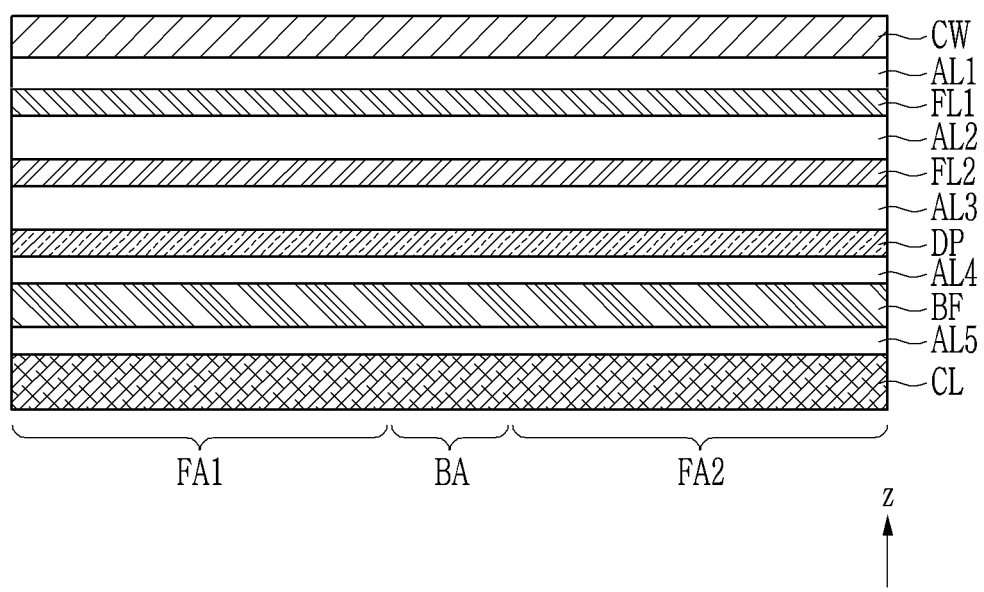
FIG. 4 is a cross-sectional view taken along line IV-IV' of FIG. 1 according to an exemplary embodiment.

FIG. 4 is a cross-sectional view taken along line IV-IV' of FIG. 1.

Referring to FIG. 4, the display device 1 has a structure in which various layers or components are stacked. The display device 1 includes a display panel DP and a cover window CW protecting the display panel DP. At least one of functional layers FL1 and FL2 may be disposed between the display panel DP and the cover window CW. A base film BF may be disposed under the display panel DP. A cushion layer CL may be disposed under the base film BF. The display panel DP, the cover window CW, the functional layers FL1 and FL2, the base film BF, and the cushion layer CL may be attached by adhesive layers AL1-AL5.

The display panel DP is a panel including a substrate, on which pixels capable of displaying an image are formed. The display panel DP may include light emitting diodes (LED) corresponding to the pixels. The display panel DP may be flexible such that at least a portion thereof may be bent. For example, the display panel DP may be flexible and bendable through at least a region thereof that corresponds to the bending area BA of the display device 1, or in some exemplary embodiments, the display panel DP may be flexible throughout the substrate.

The cover window CW is an optically transparent layer, and has a surface that is exposed to the outside of the display device 1. The cover window CW may protect the underlying structures, especially the display panel DP.

The cover window CW may be flexible, and at least a portion thereof may be bent. For example, the cover window CW may be flexible and bendable through at least a region thereof that corresponds to the bending area BA of the display device 1, or in some exemplary embodiments, the entire portion of the cover window CW may be flexible. According to an exemplary embodiment, the cover window CW may be a polymer film including a polymer, such as a polyimide (PI) or polyethylene terephthalate (PET), and have flexible characteristics. According to another exemplary embodiment, the cover window CW may be a glass film that is formed to be thin throughout (e.g., a thickness of less than about 100 micrometers), or may locally be formed thin in at least one or more regions that correspond to the bending area BA of the display device 1. In this manner, the flexible cover window CW may be more vulnerable than a rigid cover window (e.g., a glass substrate having a thickness of greater than about 100 micrometers) in protecting the display panel DP from external impacts.

The first functional layer FL1 and the second functional layer FL2 may be disposed between the display panel DP and the cover window CW. As used herein, the functional layer may refer to a layer that has a stacked structure to perform a specific function other than the adhesive function. For example, one of the first functional layer FL1 and the second functional layer FL2 may be a touch panel, and the other one may be a reflection preventing layer.

In the touch panel, for example, a touch sensor layer may be formed on a polymer film, such as a polyimide. The touch sensor layer may sense a user's contact and/or non-contact touch. The touch sensor layer may include touch electrodes formed of a transparent conductive material, such as indium tin oxide (ITO), indium zinc oxide (IZO), a metal mesh, etc., and the touch electrodes may be formed as a single layer or a multilayer. According to an exemplary embodiment, the touch sensor layer may not be provided as a separate touch panel, but may be formed directly on the surface of the display panel DP.

The reflection preventing layer may reduce external light reflection, and include a polarization layer and/or a phase delay layer that have a film shape. The reflection preventing layer may be directly formed on the display panel DP, such as being coated thereon.

The base film BF disposed below the display panel DP may have a relatively high modulus (or elasticity coefficient). The base film BF improves deformation in the bending area BA, and allows the bending area BA to be bent with a constant curvature. The base film BF may reduce an influence from an impact applied to the back of the display device 1 when the display device 1 is handled or the like. The base film BF may include metal or a metal alloy, such as Invar, stainless steel (also referred to as SUS), and may have a thickness of about 15 micrometers to about 50 micrometers, without being limited thereto. When the base film BF includes metal, a modulus thereof may be about 10 GPa to about 100 GPa, or in some exemplary embodiments, 100 GPa or more. The base film BF may also include polymer, such as a polyimide (PI) or polyethylene terephthalate (PET). When the base film BF includes polymer, a modulus thereof may be about 1 GPa to about 10 GPa, or in some exemplary embodiments, about 4 GPa to about 6 GPa.

The cushion layer CL disposed under the base film BF may protect the overlying structures, particularly the display panel DP. The cushion layer CL absorbs an impact to protect the display panel DP, and allows the display panel DP to be attached to other parts, such as a frame, a bracket, a housing, etc., without damage. The cushion layer CL may be a porous layer, such as a foam resin, for example. According to an exemplary embodiment, a functional sheet, such as a shading sheet, a heating sheet, and a waterproof tape may be further included under the base film BF, in addition to the cushion layer CL.

In the illustrated exemplary embodiment, between the cover window CW and the first functional layer FL1, between the first functional layer FL1 and the second functional layer FL2, between the second functional layer FL2 and the display panel DP, between the display panel DP and the base film BF, and between the base film BF and the cushion layer CL, adhesive layers AL1-AL5 may be respectively formed to bond adjacent layers to each other. When each of the adhesive layers AL1-AL5 is formed only with a pressure sensitive adhesive, the display device 1 may be vulnerable to an external impact. For example, when an impact is applied to the front surface of the display device 1 from a pen drop or the like, the flexible cover window CW may not adequately protect the display panel DP from such impact, thereby causing damage to the display panel DP or the touch panel, such cracks, shorts, and disconnection of the components therein. Also, buckling or cracks may be generated in the cover window CW, the first functional layer FL1, and/or the second functional layer FL2.

Hereinafter, the adhesive layers AL1 to AL5 capable of improving the impact resistance while satisfying the flexible characteristic of the flexible display device 1 will be described.

Figure 6:
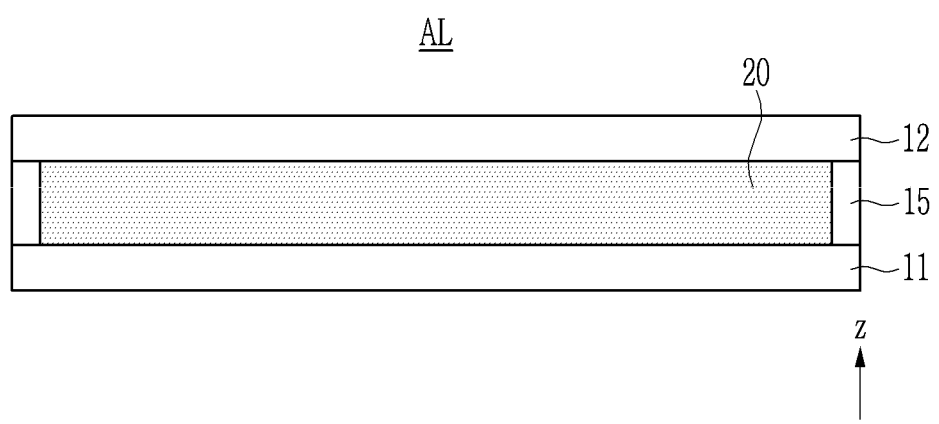
Figure 7:
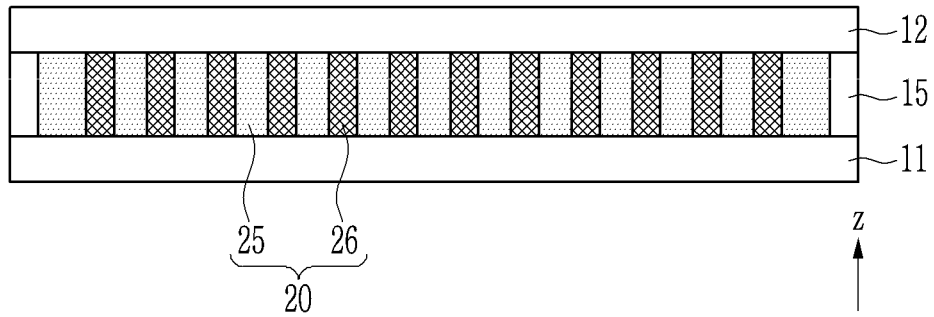
Figure 8:
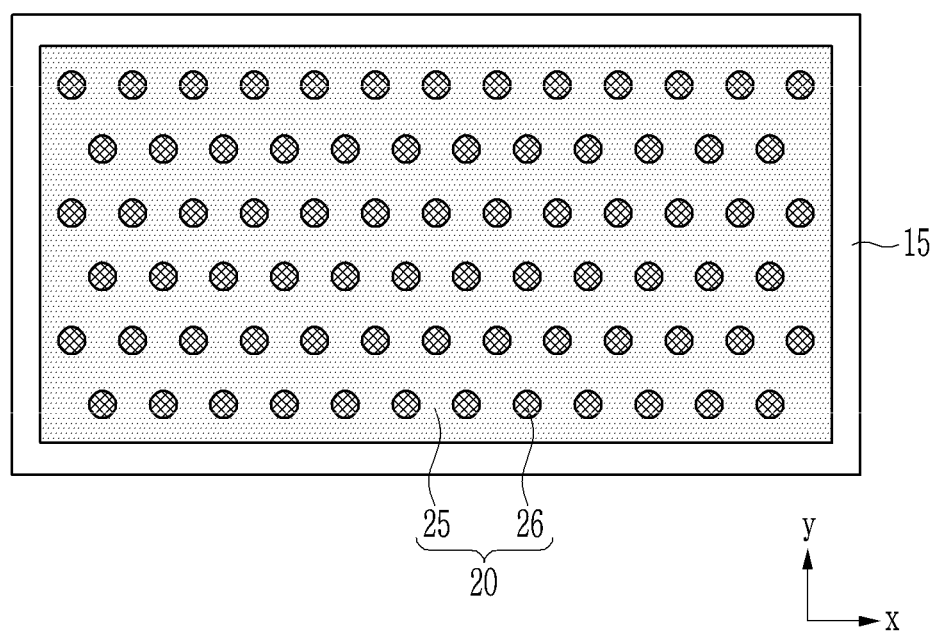

FIG. 5 to FIG. 14 are views showing a structure of an adhesive layer according to exemplary embodiments. FIG. 5 to FIG. 7 and FIG. 9 to FIG. 14 are vertical cross-sectional views, and FIG. 8 is a horizontal cross-sectional view. At least one of the adhesive layers AL1-AL5 described above may have the structure of the adhesive layer AL shown is FIG. 5 to FIG. 14.

Figure 5:
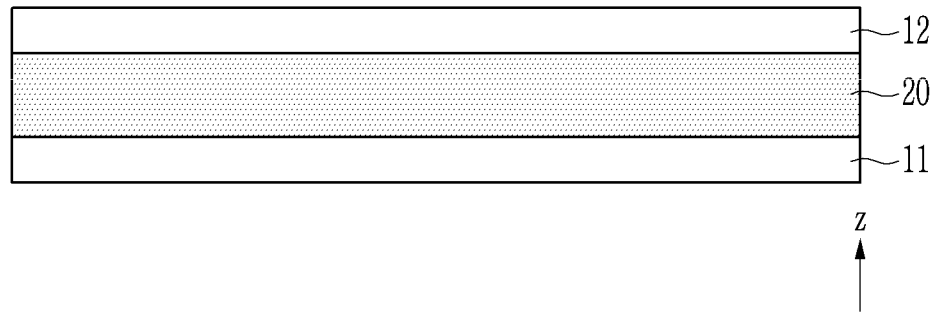
FIGS. 5, 6, 7, 8, 9, 10, 11, 12, 13, and 14 are views showing a structure of an adhesive layer according to exemplary embodiments.

Referring to FIG. 5, the adhesive layer AL according to an exemplary embodiment has a structure in which a first pressure sensitive adhesive layer 11, an elastomer layer 20, and a second pressure sensitive adhesive layer 12 are stacked. As the elastomer layer 20, a rubber, such as polyurethane (PU), may be used according to an exemplary embodiment. In this manner, since the elastomer layer 20 has excellent impact absorbing ability and resilience, the impact resistance of the display device 1 may be increased, as compared to when the adhesive layer AL is formed as a single layer of the pressure sensitive adhesive layer. Furthermore, the elastomer layer 20 may be advantageous for maintaining an original shape of the adhesive layer AL or the display device 1.

Bending the bending area BA may generate stress in the display device 1. In this case, if shearing deformation does not occur well in the adhesive layer AL, buckling may be generated in the functional layers FL1 and FL2 or the cover window CW, which may cause decoupling of these layers. As such, to prevent the occurrence of buckling or decoupling, the elastomer layer 20 may have a similar modulus to those of the first and second pressure sensitive adhesive layers 11 and 12, such as about 100 kPa or less, for example, so that the shearing deformation of the adhesive layer AL may occur well in the adhesive layer AL. In this case, the adhesive layer AL may behave as one layer against the stress, even though the elastomer layer 20 is interposed between two pressure sensitive adhesive layers 11 and 12. The modulus of the elastomer layer 20 may be varied depending on temperature. For example, the elastomer layer 20 may have a modulus of about 10 MPa or less at a low temperature (e.g., −20° C.), about 100 kPa or less at room temperature (e.g., 25° C.), and about 10 kPa or less at a high temperature (e.g., 80° C.).

When the bending area BA is bent, decoupling of the first and second pressure sensitive adhesive layers 11 and 12 and the elastomer layer 20 may occur in the adhesive layer AL. As such, the interface adherence of the first and second pressure sensitive adhesive layers 11 and 12 and the elastomer layer 20 may be about 400 gf/in$^2$ or more to prevent the occurrence of decoupling.

When the adhesive layer AL is thick, it may not only increase the thickness of the display device 1, but may also cause the buckling of the layers adhered by the adhesive layer AL. This is because buckling is more likely to occur in thin layers, and when the adhesive layer AL is formed to be thick, the adhered layers would be formed relatively thin. Accordingly, the adhesive layer AL may have a thickness of about 75 micrometers or less, about 60 micrometers or less, or about 50 micrometers or less. The elastomer layer 20, for example, may have a thickness of about one time to about five times, or about two times to about three times, the thickness of the first pressure sensitive adhesive layer 11 or the second pressure sensitive adhesive layer 12. The impact absorption ability by the adhesive layer AL may be deteriorated as the elastomer layer 20 is formed thinner. As such, when the elastomer layer 20 is formed to be thicker, the thickness of the first and second pressure sensitive adhesive layers 11 and 12 may be formed thinner, which may deteriorate the adherence of the adhesive layer AL. The first pressure sensitive adhesive layer 11 and the second pressure sensitive adhesive layer 12 may have the same or similar thicknesses. For example, when the thickness of the adhesive layer AL is about 75 micrometers, the thickness of each of the first and second pressure sensitive adhesive layers 11 and 12 may be about 15 micrometers, and the thickness of the elastomer layer 20 may be about 35 micrometers.

If an elastic behavior of the adhesive layer AL is high, generation of buckling on the layers bonded by the adhesive layer AL may be reduced. The adhesive layer AL may have a recovery characteristic of more than 90% or more than 95%. As used herein, a recovery characteristic refers a degree of the shape and dimensions being restored to its original shape and dimensions after 1 second from the deformation.

Referring to FIG. 6, the adhesive layer AL according to an exemplary embodiment substantially the same as the adhesive layer AL of FIG. 5, however, the elastomer layer 20 according to the illustrated exemplary embodiment is sealed by pressure sensitive adhesive layers 11, 12, and 15. In detail, the adhesive layer AL has the structure in which the first pressure sensitive adhesive layer 11, the elastomer layer 20, and the second pressure sensitive adhesive layer 12 are stacked, and a side pressure sensitive adhesive layer 15 encloses the side of the elastomer layer 20.

FIG. 7 and FIG. 8 are a vertical cross-sectional view and a horizontal cross-sectional view of the adhesive layer AL according to an exemplary embodiment. The adhesive layer AL according to the illustrated exemplary embodiment has a difference in a structure of the elastomer layer 20 as compared to the adhesive layer AL of FIG. 6. In detail, the elastomer layer 20 has a structure in which columns 26 having a higher modulus are disposed within an elastomer base layer 25 having a lower modulus. For example, in the elastomer layer 20, hard elastomer columns 26 each having a modulus of about 1 MPa to about 10 MPa may be formed in a soft elastomer base layer 25 having a modulus of about 1 kPa to about 100 kPa at a predetermined interval. In some exemplary embodiments, the columns 26 may have a modulus of 10 MPa or more. The lower end of each column 26 may be in contact with the first pressure sensitive adhesive layer 11. The upper end of each column 26 may be in contact with the second pressure sensitive adhesive layer 12. The elastomer layer 20 may be enclosed by the first pressure sensitive adhesive layer 11, the second pressure sensitive adhesive layer 12, and the side pressure sensitive adhesive layer 15. Alternatively, in some exemplary embodiments, at least one of the sides of the elastomer layer 20 may not be enclosed by a pressure sensitive adhesive layer.

As the hard columns 26 are included within the elastomer base layer 25, the columns 26 may protect the configurations of the display device 1 including the display panel DP from impact when the elastomer layer 20 is formed. Also, when the display device 1 is bent, in the bending area BA, the hard columns 26 may maintain the adhesive layer AL with a predetermined thickness to improve deformation of the bending area BA, and the bending area BA may be bent with a constant curvature. Also, since the hard elastomer is inserted into the soft elastomer layer 25 in the form of a column, the columns 26 may be easily inclined when applied with a shear force. As such, the shearing deformation is likely to occur even if the adhesive layer AL includes the hard elastomer columns 26, thereby preventing the occurrence of buckling in the layers adhered by the adhesive layer AL.

The columns 26 in the elastomer base layer 25 may be formed by, for example, forming holes in the elastomer layer having a low modulus by using a mask or through a laser, and filling a resin having a high modulus therein. In the elastomer layer having a low modulus, a portion where the hole is not formed becomes the elastomer base layer 25, and the resin having a high modulus filled in the holes becomes the columns 26. As another example, ultraviolet rays may be irradiated to portions of a elastomer layer having a low modulus by using a mask to partially cure the portions of the elastomer layer, thereby forming the columns 26 in the elastomer layer. The part that is not cured in the elastomer layer becomes the elastomer base layer 25, and the cured part becomes the columns 26.

Figure 9:
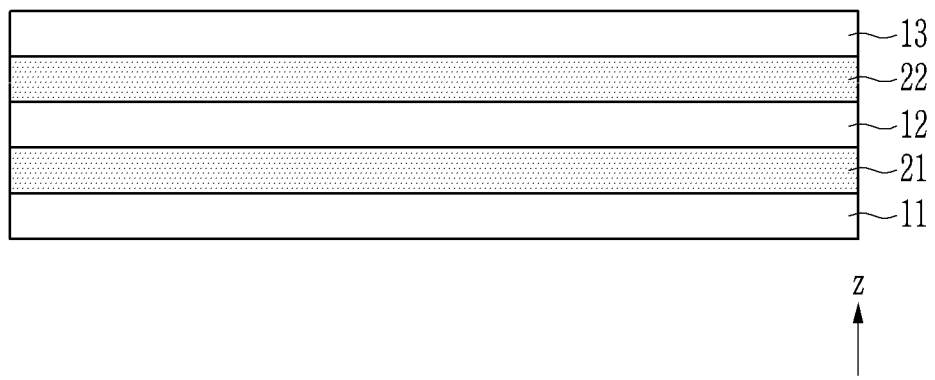

Referring to FIG. 9, the adhesive layer AL according to an exemplary embodiment includes a plurality of elastomer layers 21 and 22. The adhesive layer AL according to the illustrated exemplary embodiment has a structure in which the first pressure sensitive adhesive layer 11, the first elastomer layer 21, the second pressure sensitive adhesive layer 12, the second elastomer layer 22, and a third pressure sensitive adhesive layer 13 are sequentially stacked. When the adhesive layer AL includes a plurality of elastomer layers 21 and 22, each of the elastomer layers 21 and 22 may be formed thinner than those of the elastomer layers described above to avoid increasing the overall thickness of the adhesive layer AL. For example, when the thickness of the adhesive layer AL is about 65 micrometers, each of the first, second, and third pressure sensitive adhesive layers 11, 12, and 13 may have a thickness of about 15 micrometers, and the thickness of the first and second elastomer layers 21 and 22 may be about 10 micrometers.

When the adhesive layer AL includes a plurality of elastomer layers 21 and 22 bonded by the pressure sensitive adhesive layer 12, the flexibility of the adhesive layer AL may be improved as compared to the adhesive layers AL that include a single layer of the elastomer layer 20 as shown in FIG. 5 and FIG. 6.

Figure 10:
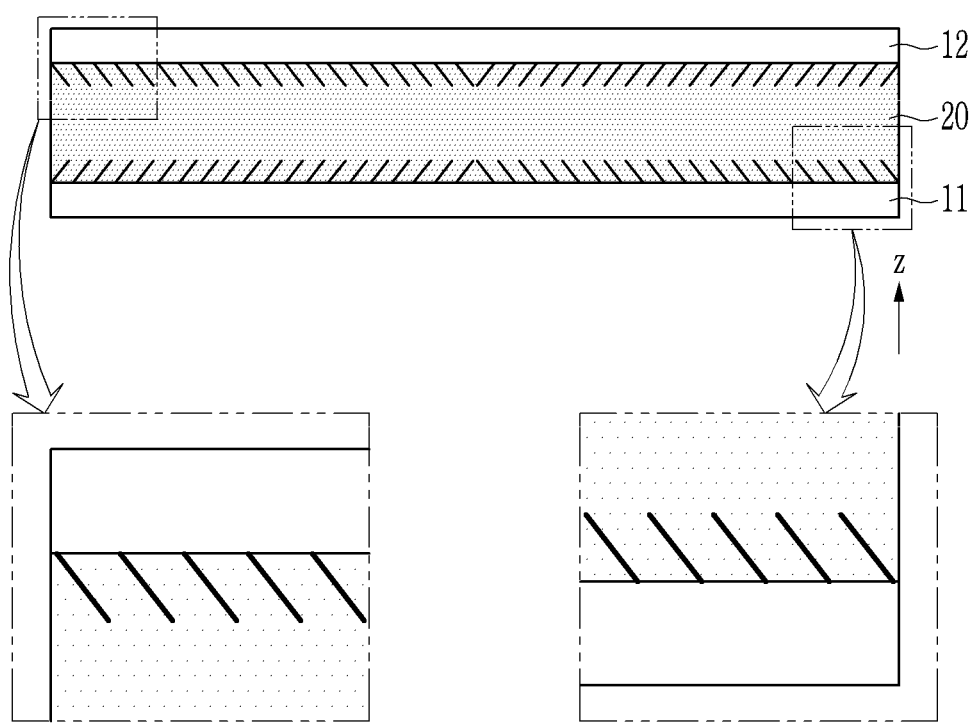

Referring to FIG. 10, the adhesive layer AL according to an exemplary embodiment has a structure in which the first pressure sensitive adhesive layer 11, the elastomer layer 20, and the second pressure sensitive adhesive layer 12 are stacked, as in the adhesive layer AL of FIG. 5. However, the elastomer layer 20 according to the illustrated exemplary embodiment is cut at a predetermined interval and a predetermined depth in an oblique direction (e.g., a direction oblique to a third direction z or longitudinal direction of the adhesive layer AL) from the surface. Hereinafter, these cuts in the elastomer layer 20 will be referred to as a cutting pattern CP. The cutting pattern CP may increase the surface roughness of the elastomer layer 20, such that the adherence of the elastomer layer 20 and the first and second pressure sensitive adhesive layers 11 and 12 may be improved. Also, when an air layer is formed on the elastomer layer 20 by the cutting pattern CP, buffering capacity of the elastomer layer 20 may be improved.

In order to prevent the cutting pattern CP from being recognized as much as possible, the cutting direction (hereinafter, a direction of the cutting pattern CP) for forming the cutting pattern CP may be in the oblique direction. In this manner, light incident to the adhesive layer AL from the opposite side of the screen may not be totally reflected by the cutting pattern CP, such that the cutting pattern CP may be reduced or prevented from being recognized. In addition, according to an exemplary embodiment, the first pressure sensitive adhesive layer 11 and the second pressure sensitive adhesive layer 12 may be subjected to a haze treatment so that the cutting pattern CP is further prevented or suppressed from being recognized by a user. The haze treatment may include mixing a particulate, for example, to a material forming the pressure sensitive adhesive layers 11 and 12, or coating the surface of the pressure sensitive adhesive layers 11 and 12.

According to the illustrated exemplary embodiment, the cutting pattern CP is formed on both surfaces of the elastomer layer 20 as shown in FIG. 10, however, the inventive concepts are not limited thereto. For example, in some exemplary embodiments, the cutting pattern CP may be formed on only one surface of the elastomer layer 20. For example, when a display device is manufactured as an in-folding device, the cutting pattern CP may be formed only at the upper surface in contact with the second pressure sensitive adhesive layer 12. As another example, when a display device is manufactured as an out-folding device, the cutting pattern CP may be formed only at the lower surface in contact with the first pressure sensitive adhesive layer 11. In this manner, the cutting pattern CP may be prevented from being opened and be visible when the display device 1 is folded.

Figure 11:
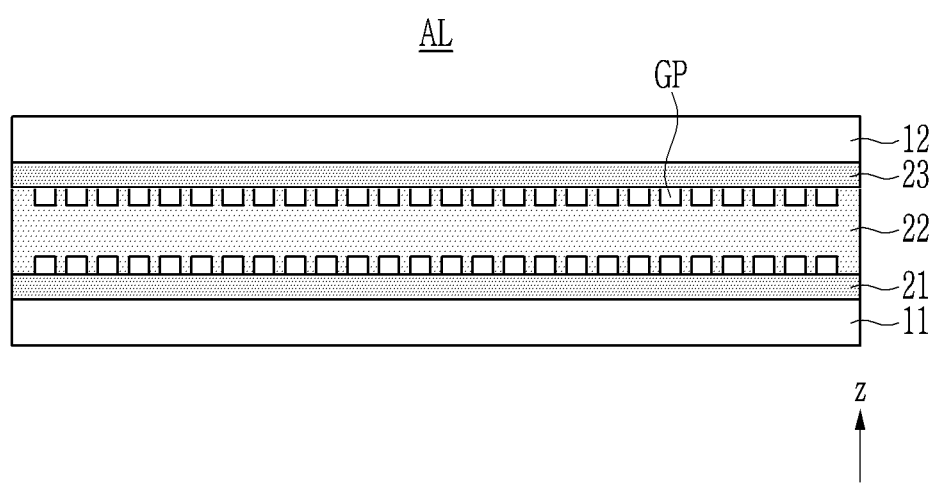
Figure 12:
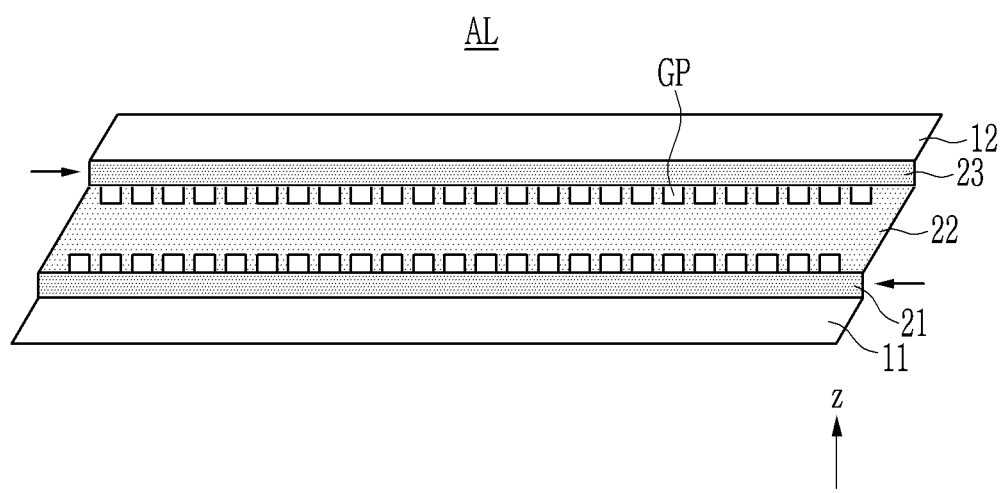

FIG. 11 is a cross-sectional view of a adhesive layer AL when the display device 1 is unfolded, and FIG. 12 is a cross-sectional view of the adhesive layer AL when the display device 1 is folded.

Referring to FIGS. 11 and 12, the adhesive layer AL according to an exemplary embodiment has a structure in which the first pressure sensitive adhesive layer 11, the first elastomer layer 21, the second elastomer layer 22, a third elastomer layer 23, and the second pressure sensitive adhesive layer 12 are stacked. The adhesive layer AL according to the illustrated exemplary embodiment is similar to the adhesive layer of FIG. 5, in that the elastomer layers 21, 22, and 23 are interposed between the first and second pressure sensitive adhesive layers 11, however there is a difference in that three elastomer layers 21, 22, and 23 are continuously stacked. Also, in the adhesive layer AL according to the illustrated exemplary embodiment, a groove pattern GP is formed at both surfaces of the second elastomer layer 22 between the first and third elastomer layers 21 and 23.

The elastomer layer 22 according to an exemplary embodiment may not have high shearing deformation, such as the pressure sensitive adhesive layers 11 and 12. Accordingly, a space such as the groove pattern GP is formed on the surface of the elastomer layer 22 to generate the shearing deformation through the space. In this manner, the interface decoupling between the elastomer layer 22 and the first and second pressure sensitive adhesive layers 11 and 12 may be reduced, and thus, the buckling may be prevented or the degree of the buckling may be reduced even if the bucking occurs.

The first elastomer layer 21 and the third elastomer layer 23 cover the groove pattern GP formed on both surfaces of the second elastomer layer 22, so that the material of the first and second pressure sensitive adhesive layers 11 and 12 is not pressed or penetrated into the groove pattern GP. When the material of the first and second pressure sensitive adhesive layers 11 and 12 is pressed into the groove pattern GP, the groove pattern GP may be recognized and the surface of the adhesive layer AL may become uneven. The space defined by the groove pattern GP, the first elastomer layer 21, and the third elastomer layer 23 may be filled with air. The groove pattern GP may be formed in various ways, and may be formed by a laser process in some exemplary embodiments. The second elastomer layer 22 and the first and third elastomer layers 21 and 23 may be thermally bonded. In order to prevent or reduce the groove pattern GP from being recognized, the first and third elastomer layers 21 and 23 and/or the first and second pressure sensitive adhesive layers 11 and 12 may be haze-treated.

Figure 13:
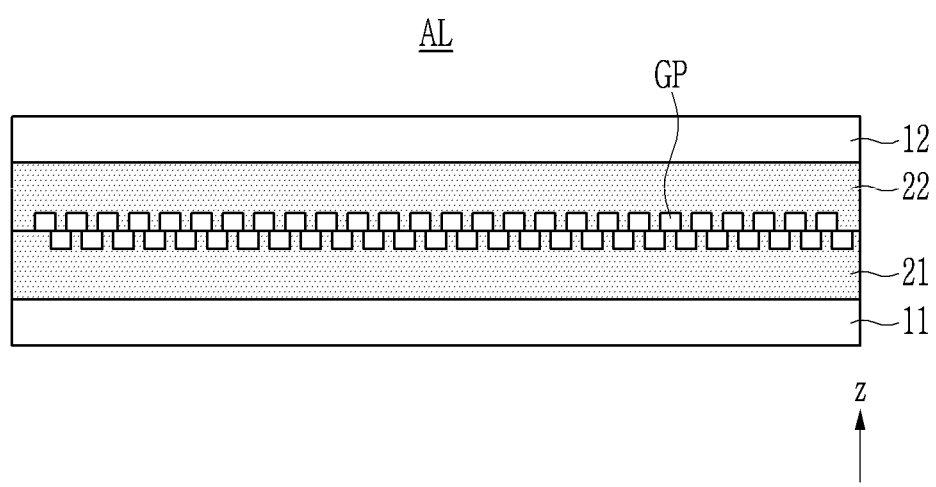

Referring to FIG. 13, the adhesive layer AL according to an exemplary embodiment has a structure in which the first pressure sensitive adhesive layer 11, the first elastomer layer 21, the second elastomer layer 22, and the second pressure sensitive adhesive layer 12 are stacked. According to the illustrated exemplary embodiment, a plurality of elastomer layers 21 and 22 are continuously stacked in the adhesive layer AL, and the groove pattern GP is formed in the elastomer layers 21 and 22, as in the adhesive layer AL of FIG. 12. However, the groove pattern GP according to the illustrated exemplary embodiment is formed on the contact surface of the first and second elastomer layers 21 and 22. More particularly, the groove pattern GP is formed at the upper surface of the first elastomer layer 21 and the lower surface of the second elastomer layer 22. Accordingly, the groove pattern GP is disposed between the first elastomer layer 21 and the second elastomer layer 22. In this manner, the groove pattern GP facilitates the shear deformation of the elastomer layers 21 and 22, thereby suppressing the interface decoupling and the buckling.

While FIG. 13 shows that the groove pattern GP is formed in both of the first and second elastomer layers 21 and 22, however, the inventive concepts are not limited thereto. For example, in some exemplary embodiments, the groove pattern GP may be formed in only one of the first and second elastomer layers 21 and 22. The first and third elastomer layers 21 and 23 and/or the first and second pressure sensitive adhesive layers 11 and 12 may be haze-treated to prevent or reduce the groove pattern GP from being recognized.

Figure 14:
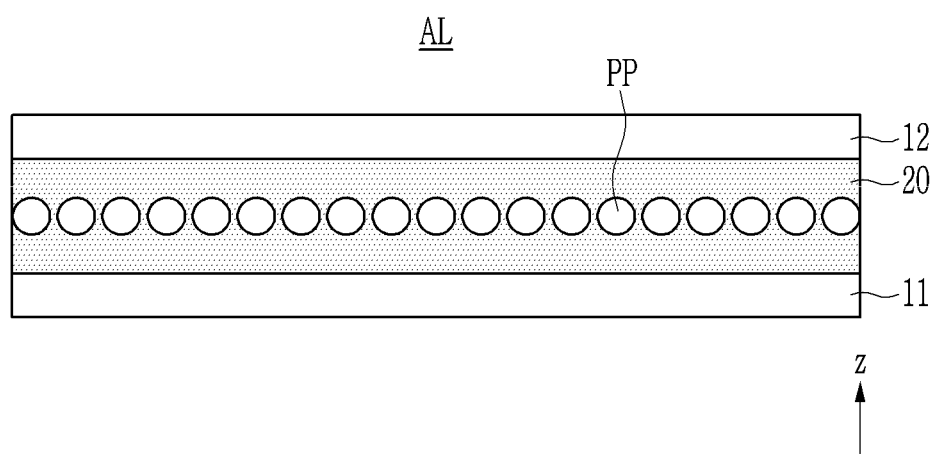

Referring to FIG. 14, the adhesive layer AL according to an exemplary embodiment has a structure in which the first pressure sensitive adhesive layer 11, the elastomer layer 20, and the second pressure sensitive adhesive layer 12 are stacked. According to the illustrated exemplary embodiment, a pore pattern PP is formed inside the elastomer layer 20. The pore pattern PP may reduce the interface decoupling and the buckling by facilitating the shearing deformation of the elastomer layer 20, as the groove pattern CP of FIGS. 12 and 13. The elastomer layer 20 and/or the first and second pressure sensitive adhesive layers 11 and 12 may be haze-treated to prevent or reduce the pore pattern PP from being recognized.

As descried above, the adhesive layer AL according to the exemplary embodiments described with reference to FIG. 5 to FIG. 14 may improve the impact resistance while allowing the shear stress to occur while reducing the stresses of the adhered layers, such as in a normal adhesive layer.

Hereinafter, the display panel DP of the display device 1 according to an exemplary embodiment will be described below with reference to FIG. 15.

Figure 15:
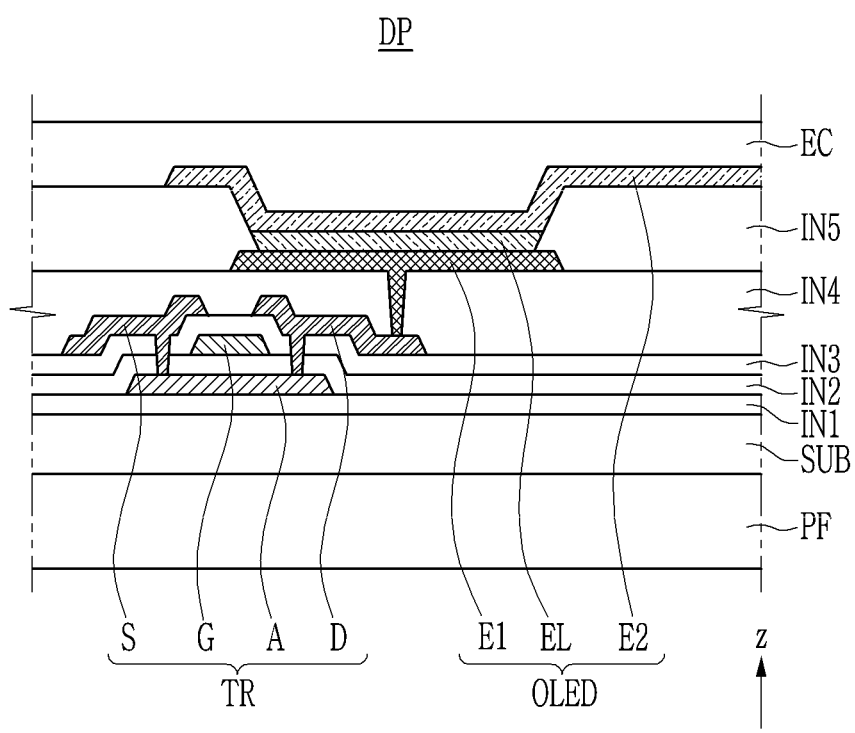
FIG. 15 is a cross-sectional view of a display panel according to an exemplary embodiment.

FIG. 15 is a cross-sectional view of a display panel according to an exemplary embodiment. FIG. 15 exemplarily illustrates a portion of the display panel DP having a stacked structure that approximately corresponds to one pixel area.

Referring to FIG. 15, the display panel DP according to an exemplary embodiment includes a substrate SUB, a transistor TR formed on the substrate SUB, and an organic light emitting diode OLED connected to the transistor TR.

The substrate SUB may be a flexible substrate made of a polymer, such as a polyimide (PI), a polyamide (PA), or polyethylene terephthalate (PET). The substrate SUB may include a barrier layer to prevent moisture, oxygen, etc. from penetrating from the outside. For example, the substrate SUB may include at least one polymer layer and at least one barrier layer, and the polymer layer and the barrier layer may be alternately stacked.

The first insulating layer IN1 is disposed on the substrate SUB. The first insulating layer IN1 may be referred to as a buffer layer, and in the process of forming a semiconductor layer A, the first insulating layer IN1 may block the impurity diffused from the substrate SUB infiltrating into the semiconductor layer A, and may reduce the stress applied to the substrate SUB. The barrier layer and first insulating layer IN1 may include an inorganic insulating material, such as silicon oxide and silicon nitride.

The semiconductor layer A of the transistor TR is disposed on the first insulating layer IN1, and a second insulating layer IN2 is disposed on the semiconductor layer A. The semiconductor layer A includes a source region and a drain region, and a channel region between these regions. The semiconductor layer A may include semiconductor materials, such as polysilicon, an oxide semiconductor, and amorphous silicon. The second insulating layer IN2 may be referred to as a gate insulating layer, and may include an inorganic insulating material.

A gate conductor including a gate electrode G of the transistor TR is disposed on the second insulating layer IN2. The gate conductor may include metal or metal alloys, such as molybdenum (Mo), copper (Cu), aluminum (Al), silver (Ag), chromium (Cr), tantalum (Ta), and titanium (Ti).

A third insulating layer IN3 is disposed on the gate conductor. The third insulating layer IN3 may be referred to as an interlayer insulating layer, and may include the inorganic insulating material.

A data conductor including a source electrode S and a drain electrode D of the transistor TR is disposed on the third insulating layer IN3. The source electrode S and the drain electrode D are respectively connected to the source region and the drain region of the semiconductor layer A through contact holes formed in the third insulating layer IN3 and the second insulating layer IN2. The data conductor is made of metal or metal alloys, such as aluminum (Al), copper (Cu), silver (Ag), molybdenum (Mo), chromium (Cr), gold, platinum (Pt), palladium (Pd), tantalum (Ta), tungsten (W), titanium (Ti), nickel (Ni), and the like.

A fourth insulating layer IN4 is disposed on the data conductor. The fourth insulating layer IN4 may be referred to as a planarizing layer, and may include the organic insulating material.

A first electrode E1 is disposed on the fourth insulating layer IN4. The first electrode E1 may be referred to as a pixel electrode. The first electrode E1 is connected to the drain electrode D though a contact hole formed in a fourth insulating layer IN4, thereby receiving the data signal controlling the luminance of an organic light emitting diode OLED.

A fifth insulating layer IN5 is disposed on the fourth insulating layer IN4. The fifth insulating layer IN5 may be referred to as a pixel defining layer, and has an opening overlapping the first electrode E1. In the opening of the fifth insulating layer IN5, an emission layer EL is disposed on the first electrode E1, and the second electrode E2 is disposed on the emission layer EL. The second electrode E2 may be referred to as a common electrode CE.

The first electrode E1, the emission layer EL, and the second electrode E2 together form the organic light emitting diode OLED. The first electrode E1 may be an anode of the organic light emitting diode OLED, and the second electrode E2 may be a cathode of the organic light emitting diode OLED.

An encapsulation layer EC is disposed on the second electrode E2. The encapsulation layer EC encapsulates the organic light emitting diode OLED to prevent moisture or oxygen from penetrating from the outside. The encapsulation layer EC may include at least one inorganic material layer and at least one organic material layer, and may have alternating inorganic material layers and organic material layers.

A protection film PF may be disposed under the substrate SUB to protect the display panel DP.

The window CW, first functional layer FL1, and/or second functional layer FL2 according to an exemplary embodiment may be attached on the encapsulation layer EC of the display panel DP by the adhesive layer AL described above. The base film BF and/or cushion layer CL according to an exemplary embodiment may be adhered under the protective film PF of the display panel DP by the adhesive layer AL according to an exemplary embodiment.

Although the display panel DP has been described above with reference to an organic light emitting panel is described, however the inventive concepts are not limited thereto. In some exemplary embodiments, the display panel DP may be a display panel including a light emitting diode (LED), or a display panel including a liquid crystal layer, for example.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A flexible display device comprising:
a display panel;
a cover window disposed on the display panel, the cover window being optically transparent; and
a first adhesive layer disposed between the display panel and the cover window,
wherein the first adhesive layer includes a first pressure sensitive adhesive layer, a second pressure sensitive adhesive layer, and a first elastomer layer disposed between the first pressure sensitive adhesive layer and the second pressure sensitive adhesive layer, and wherein the first elastomer layer is disposed continuously over an entire area of the first pressure sensitive adhesive layer or the second pressure sensitive adhesive layer.

2. The flexible display device of claim 1, further comprising:
a first functional layer disposed between the first adhesive layer and the display panel; and
a second adhesive layer disposed between the first functional layer and the display panel,
wherein the second adhesive layer includes a third pressure sensitive adhesive layer, a fourth pressure sensitive adhesive layer, and a second elastomer layer disposed between the third pressure sensitive adhesive layer and the fourth pressure sensitive adhesive layer.

3. The flexible display device of claim 2, wherein the first functional layer comprises at least one of a polarization layer and a touch panel.

4. The flexible display device of claim 2, further comprising:
a second functional layer disposed between the second adhesive layer and the display panel; and
a third adhesive layer disposed between the second functional layer and the display panel,
wherein the third adhesive layer includes a fifth pressure sensitive adhesive layer, a sixth pressure sensitive adhesive layer, and a third elastomer layer between the fifth pressure sensitive adhesive layer and the sixth pressure sensitive adhesive layer.

5. The flexible display device of claim 4, wherein the second functional layer comprises at least one of a polarization layer and a touch panel.

6. The flexible display device of claim 1, wherein the first adhesive layer has a thickness less than about 75 micrometers.

7. The flexible display device of claim 1, wherein an adhesion between the first pressure sensitive adhesive layer and the first elastomer layer is about 400 gf/in$^2$ or more.

8. The flexible display device of claim 1, wherein the first elastomer layer has a modulus of about 100 kPa or less.

9. The flexible display device of claim 1, wherein the first elastomer layer includes an elastomer base layer and a plurality of columns disposed within the elastomer base layer.

10. The flexible display device of claim 9, wherein the plurality of columns have a higher modulus than the elastomer base layer.

11. The flexible display device of claim 9, wherein the plurality of columns have a lower end in contact with the first pressure sensitive adhesive layer and an upper end in contact with the second pressure sensitive adhesive layer.

12. The flexible display device of claim 1, wherein the first adhesive layer further includes a third pressure sensitive adhesive layer and a second elastomer layer disposed between the second pressure sensitive adhesive layer and the third pressure sensitive adhesive layer.

13. The flexible display device of claim 1, wherein the first elastomer layer includes a cutting pattern formed on at least one surface thereof, the cutting pattern being formed in a direction oblique to a longitudinal direction of the first elastomer layer.

14. The flexible display device of claim 1, wherein:
the first elastomer layer includes a lower elastomer layer, a middle elastomer layer, and an upper elastomer layer that are continuously stacked; and
the middle elastomer layer includes a groove pattern formed on at least one surface thereof.

15. The flexible display device of claim 1, wherein:
the first elastomer layer includes a lower elastomer layer and an upper elastomer layer that are continuously stacked; and
the lower elastomer layer and the upper elastomer layer include a groove pattern formed at an interface therebetween.

16. The flexible display device of claim 1, wherein the first elastomer layer includes a pore pattern formed therein.

17. A flexible display device comprising:
a display panel;
a cover window disposed on the display panel, the cover window being optically transparent;
at least one functional layer disposed between the cover window and the display panel;
a first adhesive layer disposed between the display panel and the functional layer; and
a second adhesive layer disposed between the functional layer and the cover window,
wherein each of the first and second adhesive layers includes a plurality of pressure sensitive adhesive layers and at least one elastomer layer disposed between the plurality of pressure sensitive adhesive layers, and
wherein the at least one elastomer layer is disposed continuously over an entire area of at least one of the plurality of pressure sensitive adhesive layers.

18. The flexible display device of claim 17, wherein the elastomer layer includes an elastomer base layer and a plurality of columns disposed within the elastomer base layer.

* * * * *